(12) United States Patent
Asahina et al.

(10) Patent No.: US 9,383,437 B2
(45) Date of Patent: Jul. 5, 2016

(54) RECEPTION DEVICE AND RECEPTION METHOD

(71) Applicant: MITSUBISHI ELECTRIC CORPORATION, Tokyo (JP)

(72) Inventors: Tsutomu Asahina, Tokyo (JP); Daisuke Shimbo, Tokyo (JP); Satoshi Murata, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/771,284

(22) PCT Filed: Nov. 27, 2013

(86) PCT No.: PCT/JP2013/081920
§ 371 (c)(1),
(2) Date: Aug. 28, 2015

(87) PCT Pub. No.: WO2014/167749
PCT Pub. Date: Oct. 16, 2014

(65) Prior Publication Data
US 2016/0011306 A1 Jan. 14, 2016

(30) Foreign Application Priority Data

Apr. 10, 2013 (JP) ................................ 2013-081937

(51) Int. Cl.
*H04W 24/00* (2009.01)
*G01S 11/06* (2006.01)
(Continued)

(52) U.S. Cl.
CPC .............. *G01S 11/06* (2013.01); *H03G 3/3052* (2013.01); *H04B 1/12* (2013.01)

(58) Field of Classification Search
CPC . H04W 64/00; H04W 4/025; H04M 2242/30; G01S 13/345
USPC .............. 455/456.1, 440, 456.3, 404.2, 562.1
See application file for complete search history.

(56) References Cited

U.S. PATENT DOCUMENTS

| | | | |
|---|---|---|---|
| 5,904,725 A * | 5/1999 | Iisaka | G01S 5/16 348/116 |
| 6,813,309 B1 | 11/2004 | Ogino | |
| 7,123,131 B2 * | 10/2006 | Arai | B60K 35/00 340/425.5 |

(Continued)

FOREIGN PATENT DOCUMENTS

| | | | |
|---|---|---|---|
| JP | 10-271552 A | 10/1998 | |
| JP | 11-500300 A | 1/1999 | |

(Continued)

*Primary Examiner* — Sonny Trinh
(74) *Attorney, Agent, or Firm* — Birch, Stewart, Kolasch & Birch, LLP

(57) ABSTRACT

A reception device (100) includes: AGC circuits (103) to generate electric power information individually indicating signal strengths of respective received signals generated from a respective plurality of radio waves received at a plurality of places; stationary-state detection circuits (105) to calculate individually the amounts of time domain fluctuation in the respective signal strengths indicated by the electric power information generated by the AGC circuits (103), and to detect individually, on the basis of the respective calculated amounts of fluctuation, whether the reception device (100) is stationary or not; and a self-stationary determination circuit (106) to determine, on the basis of a plurality of detection results from the stationary-state detection circuits (105), whether the reception device (100) is stationary or not.

14 Claims, 7 Drawing Sheets

(51) Int. Cl.
*H03G 3/30* (2006.01)
*H04B 1/12* (2006.01)

(56) References Cited

U.S. PATENT DOCUMENTS

| | | | |
|---|---|---|---|
| 8,527,140 B2 * | 9/2013 | Schwartz | B60R 25/00 340/539.13 |
| 9,152,609 B2 * | 10/2015 | Schwartz | B60R 25/00 |
| 2004/0184411 A1 | 9/2004 | Tamura | |

FOREIGN PATENT DOCUMENTS

| | | |
|---|---|---|
| JP | 2000-22665 A | 1/2000 |
| JP | 2000-92540 A | 3/2000 |
| JP | 2004-235777 A | 8/2004 |
| JP | 4154590 B2 | 9/2008 |
| JP | 2009-10535 A | 1/2009 |
| JP | 4511325 B2 | 7/2010 |
| JP | 2011-141226 A | 7/2011 |
| WO | WO 97/21318 A1 | 6/1997 |

* cited by examiner

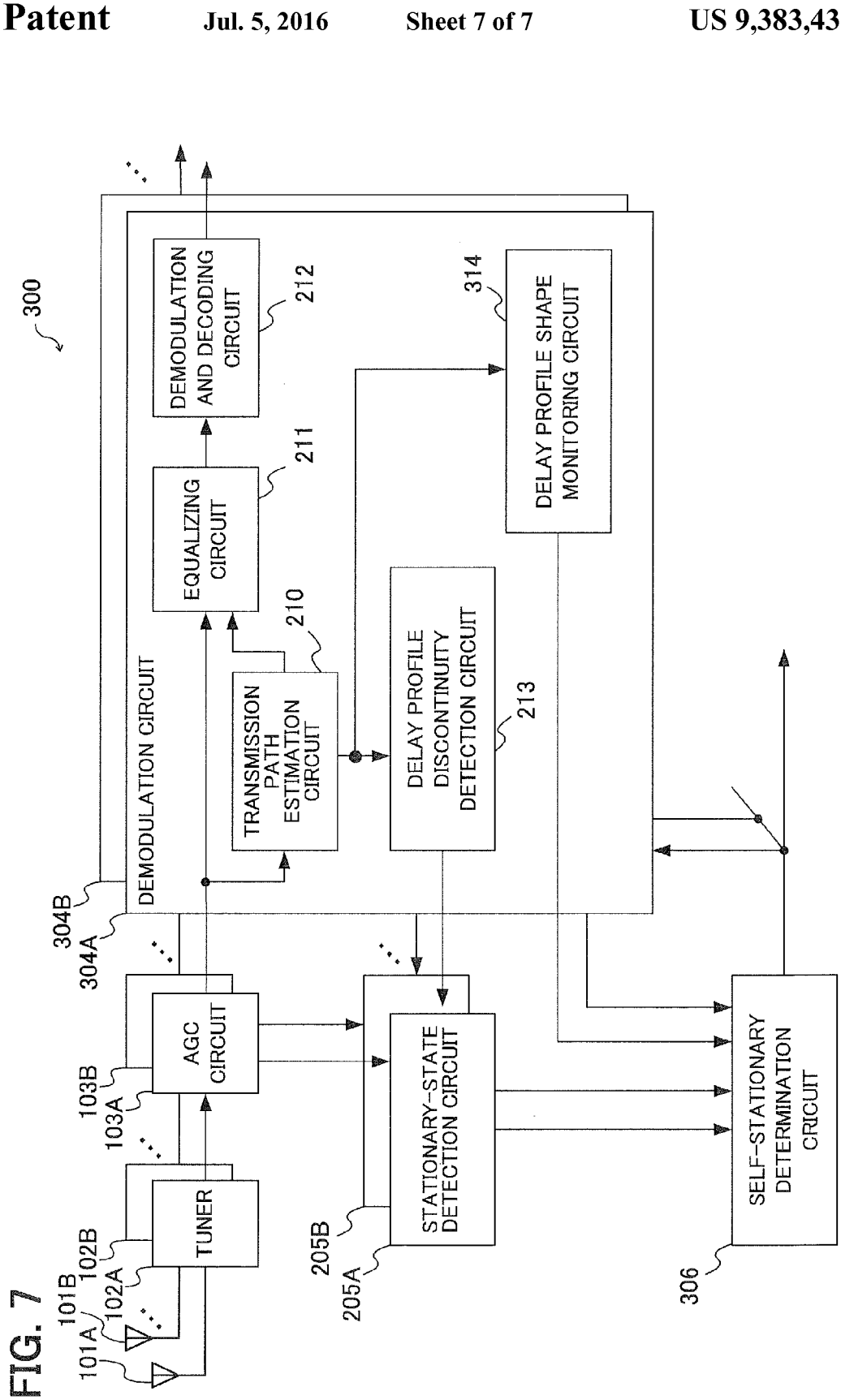

RECEPTION DEVICE AND RECEPTION METHOD

TECHNICAL FIELD

The present invention relates to a reception device and a reception method.

BACKGROUND ART

For mobile communication, detecting a moving speed yields various advantages. In almost all cases, mobile communication is configured by wireless using radio waves, and various situations arise depending on the radio wave environment. It is not easy to detect a moving speed in this context.

In conventional motion speed detection methods, there is a means using the GPS, which is well known art. There is another means, i.e., calculating a moving speed from a pitch of a fading frequency (see, for example, patent reference 1). There is further another means, i.e., calculating a moving speed from the amount of phase rotation of a received signal (see, for example, patent reference 2). There is still further another means, i.e., calculating a moving speed from temporal fluctuations in an MER (Modulation Error Rate) of a modulated signal (see, for example, patent reference 3).

PRIOR ART REFERENCES

Patent References

Patent reference 1: Japanese Translation of PCT Patent Application, Japanese Publication No. 11-500300 (FIG. 4)
Patent reference 2: Japanese Patent No. 4154590 (paragraphs 0026-0040, FIG. 3)
Patent reference 3: Japanese Patent Application Publication No. 2011-141226 (paragraphs 0048-0066, FIG. 4)

SUMMARY OF THE INVENTION

Problem to be Solved by the Invention

However, in all patent references 1, 2, and 3, there is a problem: it is not possible to detect that the reception device itself is stationary when physical parameters of a received signal fluctuate because of fluctuations in an environment surrounding the reception device.

The present invention is made to cope with the problem mentioned above and an object of the present invention is to enable to detect that the reception device itself is stationary even when the environment surrounding the reception device fluctuates.

Means for Solving the Problem

In one aspect of the present invention, a reception device to receive radio waves includes: an automatic gain control unit to generate electric power information individually indicating signal strengths of respective received signals generated from a respective plurality of radio waves received at a plurality of places; a stationary-state detection unit to calculate individually amounts of time domain fluctuation in the respective signal strengths indicated by the electric power information generated by the automatic gain control unit, and to detect individually, on the basis of each of the calculated amounts of fluctuation, whether the reception device is stationary or not; and a self-stationary determination unit to determine, on the basis of a plurality of detection results from the stationary-state detection unit, whether the reception device is stationary or not.

In another aspect of the present invention, a reception method includes: a signal strength detection step to generate electric power information individually indicating signal strengths of respective received signals generated from a respective plurality of radio waves received at a plurality of places; a stationary-state detection step to calculate amounts of time domain fluctuation in the respective signal strengths indicated by the electric power information generated in the signal strength detection step, and to detect individually, on the basis of each of the calculated amounts of fluctuation, whether a stationary-state is detected or not; and a self-stationary determination step to determine, on the basis of a plurality of detection results from the stationary-state detection step, whether the stationary-state is detected or not.

Effect of the Invention

According to one aspect of the present invention, by the use of a plurality of stationary-state detection results, it is hardly influenced by fluctuations in a surrounding environment, and it is possible to detect that the reception device itself is stationary even when the surrounding environment of the reception device fluctuates.

BRIEF DESCRIPTION OF THE DRAWINGS

FIG. 7 is a block diagram schematically illustrating the configuration of a reception device according to a third embodiment.

MODE FOR CARRYING OUT THE INVENTION

A reception device and a reception method to which the present invention is applied will be described below. In addition, a vehicle-mounted reception device for broadcast waves will be described in the embodiments below, but the present invention is not limited to this.

First Embodiment

Figure 1:
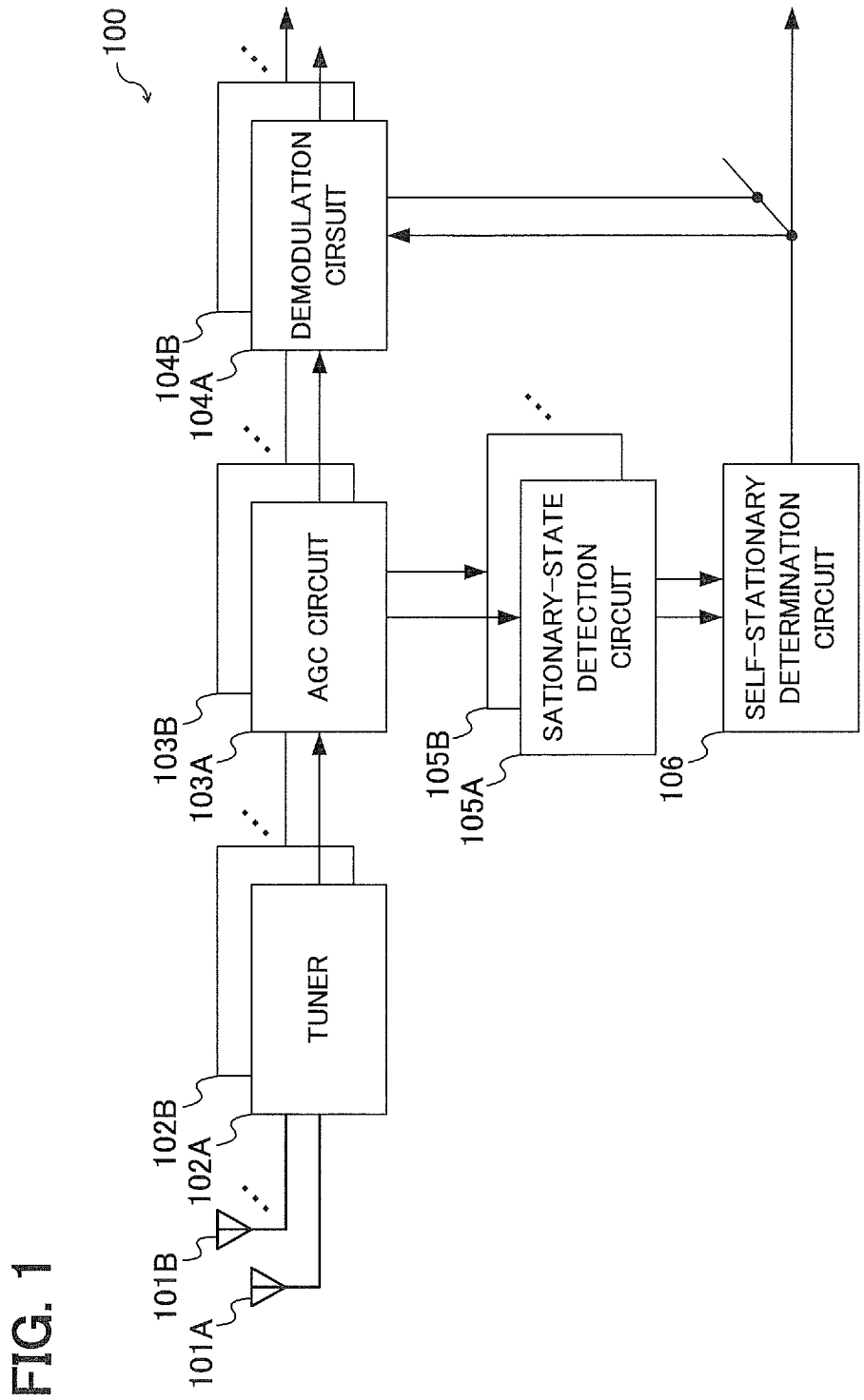
FIG. 1 is a block diagram schematically illustrating the configuration of a reception device according to a first embodiment.

FIG. 1 is a block diagram schematically illustrating the configuration of a reception device 100 according to a first embodiment. The illustrated reception device 100 receives radio waves. The reception device 100 includes a plurality of antennas 101A, 101B, ... (referred to below as antennas 101 when there is no particular need to distinguish them from each other), a plurality of tuners 102A, 102B, ... (referred to below as tuners 102 when there is no need to distinguish them from each other in particular), a plurality of AGC circuits 103A, 103B, ... (referred to below as AGC circuits 103 when there is no particular need to distinguish them from each other), a plurality of demodulation circuits 104A, 104B, ... (referred to below as demodulation circuits 104 when there is no particular need to distinguish them from each other), a plurality of stationary-state detection circuits 105A, 105B, ... (referred to below as stationary-state detection circuits 105 when there is no particular need to distinguish them from each other), and a self-stationary determination circuit 106.

The antennas 101 receive radio waves. By including a plurality of antennas 101, the reception device 100 can receive radio waves at a plurality of places. In addition, the respective antennas 101 are installed at a plurality of places on a vehicle in which the reception device 100 is mounted, for example. It is preferable here that the plurality of antennas 101 be installed in places that are different in their surrounding environments from each other. For example, it is preferable to be installed at front and back locations on the vehicle, left and right locations on the vehicle, or the like.

The tuners 102 constitute a reception unit for generating received signals from the radio waves received at the antennas 101. In addition, in this embodiment, the number of the tuners 102 is the same as the number of the antennas 101, each of the tuners 102 is connected to each of the antennas 101, and thus the tuners 102 can individually generate the received signals from the radio waves received at the respective antennas 101.

The AGC circuits 103 constitute an automatic gain control unit for individually adjusting the electric power of the respective received signals generated from the respective radio waves received at the plurality of places. The AGC circuits 103 adjust the electric power of the received signals generated by the tuners 102 to predetermined electric power, for example. Then, the AGC circuits 103 supply the adjusted received signals to the demodulation circuits 104.

Moreover, the AGC circuits 103 generate electric power information individually indicating the signal strengths of the respective received signals generated by the tuners 102, and supply the electric power information to the demodulation circuits 104 and stationary-state detection circuits 105.

In addition, in the first embodiment, the number of the AGC circuits 103 is the same as the number of the tuners 102, each of the AGC circuits 103 is connected to each of the tuners 102, and thus the AGC circuits 103 can individually adjust the received signals generated by the tuners 102 and can generate the electric power information individually indicating the signal strengths of the received signals generated by the tuners 102.

The demodulation circuits 104 constitute a demodulation unit for correcting distortion on a transmission path of the adjusted received signals supplied from the AGC circuits 103, and for demodulating and decoding the corrected signals. The demodulation circuits 104 supply the processed signals to a downstream stage. In addition, in this embodiment, the number of the demodulation circuits 104 is the same as the number of the AGC circuits 103, each of the demodulation circuits 104 is connected to each of the AGC circuits 103, and thus the demodulation circuits 104 can individually process the respective adjusted received signals supplied from the AGC circuits 103.

The stationary-state detection circuits 105 constitute a stationary-state detection unit for individually calculating the respective amounts of time domain fluctuation in the signal strengths indicated by the electric power information supplied from the AGC circuits 103, and for detecting, on the basis of the calculated amounts of fluctuation, whether the reception device 100 is stationary or not. When the reception device 100 itself is stationary, the amount of fluctuation decreases; when the reception device 100 itself is moving, the amount of fluctuation increases. From the property mentioned above, the stationary-state detection circuit 105 detects that the reception device 100 is stationary, by comparing the amount of fluctuation with a predetermined first threshold value. In other words, if the amount of fluctuation is equal to or less than the first threshold value, the stationary-state detection circuit 105 determines that the reception device 100 itself is stationary, and supplies a stationary state determination signal to the self-stationary determination circuit 106.

In addition, when the electric power information supplied from the AGC circuits 103 is smaller than a predetermined second threshold value, the stationary-state detection circuits 105 may assure accuracy of reliability of the received signals, by not using such electric power information in the process of calculating the amount of time domain fluctuation. It may be configured that the first and second threshold values are preset, or externally supplied.

Moreover, in this embodiment, the number of the stationary-state detection circuits 105 is the same as the number of the AGC circuits 103, each of the stationary-state detection circuits 105 is connected to each of the AGC circuits 103, and thus the stationary-state detection circuits 105 can individually calculate the amounts of fluctuation in the respective signal strengths on the basis of the electric power information supplied from the AGC circuits 103 and can individually perform detection that the reception device 100 is stationary on the basis of the amounts of fluctuation.

Figure 2:
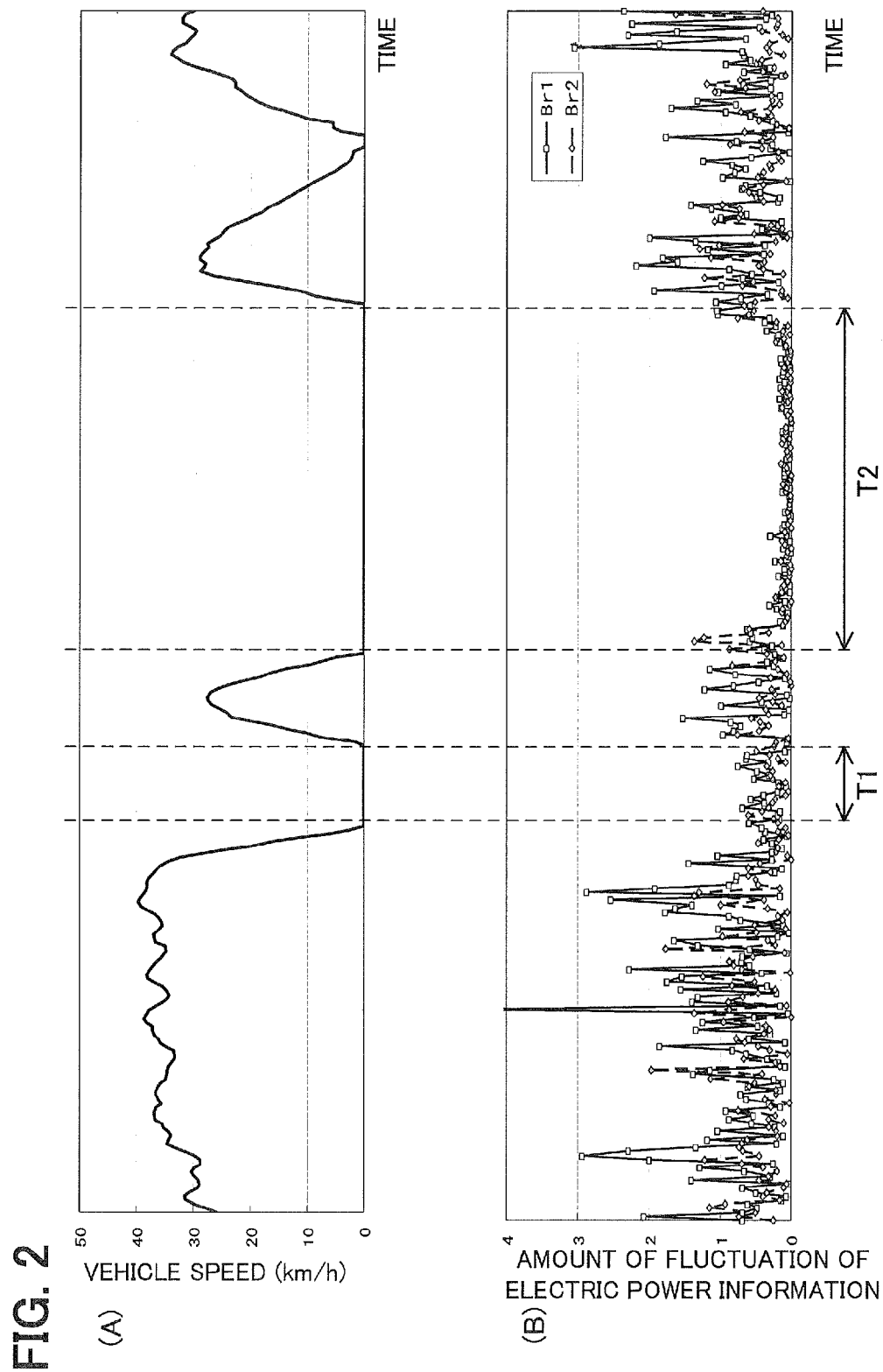
FIGS. 2(A) and 2(B) are schematic diagrams illustrating a relationship between a speed of a vehicle in which the reception device according to the first embodiment is mounted and the amount of fluctuation in signal strength indicated by electric power information.

FIGS. 2(A) and 2(B) are schematic diagrams illustrating a relationship between a vehicle speed of a vehicle in which the reception device 100 is mounted and the amount of fluctuation in the signal strength indicated by the electric power information. FIG. 2(A) shows the vehicle speed of the vehicle in which the reception device 100 is mounted; FIG. 2(B) shows the amounts of fluctuation calculated by the stationary-state detection circuits 105 in the reception device 100. In addition, the vehicle speed shown in FIG. 2(A) is obtained by using the GPS.

Time periods T1 and T2 in FIGS. 2(A) and 2(B) are time periods during which the vehicle in which the reception device 100 is mounted is stopped. As shown in FIG. 2(B), the amount of fluctuation in the electric power information is small in time periods T1 and T2. Br1 in FIG. 2(B) denotes the amount of fluctuation calculated by the stationary-state detection circuit 105A on the basis of the electric power information obtained through the antenna 101A, tuner 102A, and AGC circuit 103A. Br2 in FIG. 2(B) denotes the amount of fluctuation calculated by the stationary-state detection circuit 105B on the basis of the electric power information obtained through the antenna 101B, tuner 102B, and AGC circuit 103B. It is understood from FIGS. 2(A) and 2(B) that the reception device 100 according to this embodiment is capable of detecting that the vehicle is stationary.

Figure 3:
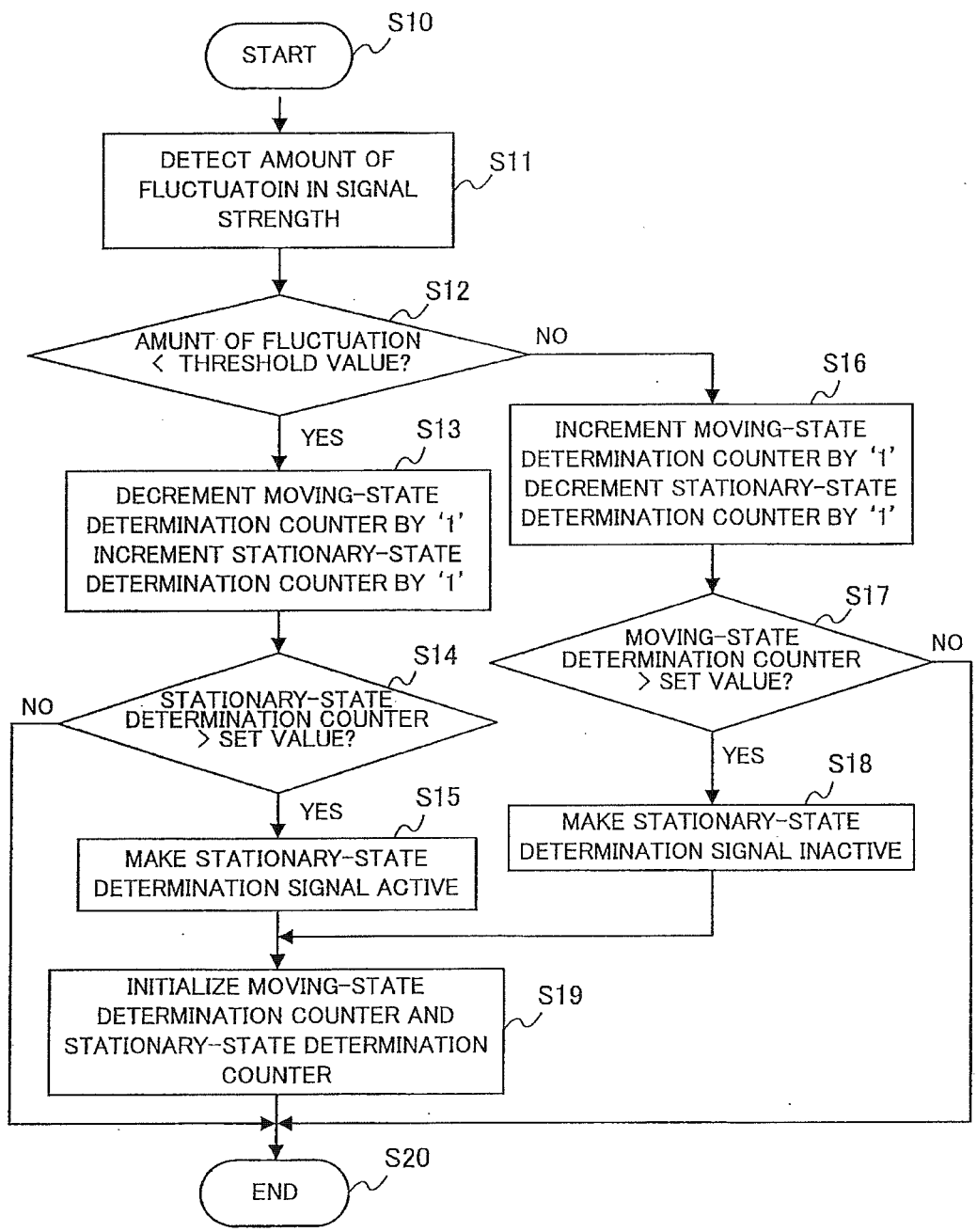
FIG. 3 is a flowchart illustrating a process carried out by a stationary-state detection circuit in the first embodiment.

FIG. 3 is a flowchart illustrating a process carried out by the stationary-state detection circuit 105. The flowchart illustrated in FIG. 3 is carried out every time the electric power information output from the AGC circuits 103 is updated. The flowchart illustrated in FIG. 3 includes a starting step S10, an amount-of-fluctuation-in-electric-power-information calculation step S11, an amount-of-fluctuation comparison step S12, a stationary state progress step S13, a stationary state determination step S14, a stationary state determination processing step S15, a moving state progress step S16, a moving state determination step S17, a moving state determination processing step S18, an initialization step S19, and a termination step S20.

The starting step S10 is carried out every time the electric power information output from the AGC circuits 103 is updated; the process then proceeds to the amount-of-fluctuation-in-electric-power-information calculation step S11. The update cycle may be preset or externally supplied, and moreover it may be a unit of a carrier wave.

In the amount-of-fluctuation-in-electric-power-information calculation step S11, the stationary-state detection circuit 105 calculates the absolute value of the difference between the signal strength indicated by inputted electric power information and the signal strength indicated by preceding inputted electric power information held in a memory (not shown in the drawings) outside or inside its own circuitry, thereby calculating the amount of fluctuation in the electric power information. The stationary-state detection circuit 105 records the calculated amount of fluctuation in the electric power information and the inputted electric power information itself, in the memory (not shown in the drawings) outside or inside its own circuitry. Then, the process proceeds to the amount-of-fluctuation comparison step S12.

In the amount-of-fluctuation comparison step S12, the stationary-state detection circuit 105 compares the amount of fluctuation in the electric power information calculated in the amount-of-fluctuation-in-electric-power-information calculation step S11 with a threshold value (first threshold value). If the amount of fluctuation in the electric power information is less than the threshold value (S12: Yes), the process proceeds to the stationary state progress step S13; if the amount of fluctuation in the electric power information is equal to or greater than the threshold value (S12: No), the process proceeds to the moving state progress step S16. In addition, the threshold value may be preset, or externally supplied.

In addition, in the step S12, the amount of fluctuation in the electric power information calculated in the step S11 is compared with the threshold value, however the stationary-state detection circuit 105 may compare a result of calculating a temporal average or a movement average of the amounts of fluctuation in the electric power information calculated in the step S11, with the threshold value. The number of samples for the average may be preset, or externally supplied.

In the stationary state progress step S13, the stationary-state detection circuit 105 adds '1' to a stationary-state determination counter and subtracts '1' from a moving-state determination counter, since it determines in the amount-of-fluctuation comparison step S12 that the amount of fluctuation in the electric power information is small, that is, it is in the stationary state. Then, the process proceeds to the stationary state determination step S14. In addition, the stationary-state determination counter and moving-state determination counter are stored in the memory (not shown in the drawings) outside or inside the stationary-state detection circuit 105. Moreover, the stationary-state detection circuit 105 performs control to keep the moving-state determination counter from going below '0'.

In the stationary state determination step S14, the stationary-state detection circuit 105 monitors whether the stationary-state determination counter incremented in the stationary state progress step S13 exceeds a set value (third threshold value), thereby detecting continuity of the stationary state. If the stationary-state determination counter exceeds the set value, that is, if the stationary-state detection circuit 105 has made stationary-state determinations successively (S14: Yes), the process proceeds to the stationary state determination processing step S15. On the other hand, if the stationary-state determination counter does not exceed the set value (S14: No), the process proceeds to the termination step S20. The set value here may be preset, or externally supplied.

In the stationary state determination processing step S15, the stationary-state detection circuit 105 makes the stationary state determination signal active, since the stationary state determination condition is satisfied in the stationary state determination step S14. Then, the process proceeds to the initialization step S19.

In the moving state progress step S16, the stationary-state detection circuit 105 adds '1' to the moving-state determination counter and subtracts '1' from the stationary-state determination counter, since it determines in the amount-of-fluctuation comparison step S12 that the amount of fluctuation in the electric power information is large, that is, it is in the moving state. Then, the process proceeds to the moving state determination step S17. In addition, the stationary-state detection circuit 105 performs control to keep the stationary-state determination counter from going below '0'.

In the moving state determination step S17, the stationary-state detection circuit 105 monitors whether the moving-state determination counter incremented in the moving state progress step S16 exceeds a set value (fourth threshold value), thereby detecting continuity of the moving state. If the moving-state determination counter exceeds the set value, that is, if the stationary-state detection circuit 105 successively performs moving-state determinations has made moving-state determinations successively (S17: Yes), the processing proceeds to the moving state determination processing step S18. On the other hand, if the moving-state determination counter does not exceed the set value (S17: No), the process proceeds to the termination step S20. The set value here may be preset, or externally supplied.

In the moving state determination processing step S18, the stationary-state detection circuit 105 makes the stationary state determination signal inactive, since the moving state determination condition is satisfied in the moving state determination step S17. Then, the process proceeds to the initialization step S19.

In the initialization step S19, when the stationary-state detection circuit 105 switches the stationary state determination signal to active or inactive in the stationary state determination processing step S15 or the moving state determination processing step S18, it returns both of the stationary-state determination counter and the moving-state determination counter to the initial state (for example, '0'). Then, the process proceeds to the termination step S20.

Figure 4:
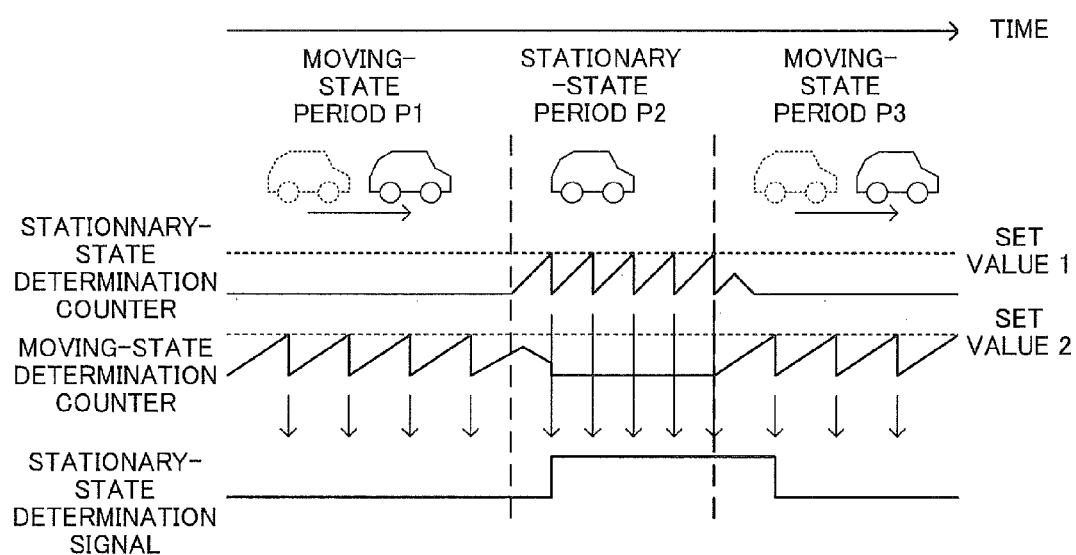
FIG. 4 is a schematic diagram illustrating an example of the behavior of a moving-state determination counter, a stationary-state determination counter, and a stationary-state determination signal when the processing flow of the stationary-state detection circuit in the first embodiment is executed.

FIG. 4 is a schematic diagram illustrating an example of the behavior of the moving-state determination counter, the stationary-state determination counter, and the stationary-state determination signal when the processing flow of the stationary-state detection circuit 105 shown in FIG. 3 is executed.

As shown in FIG. 4, during moving-state period P1, the moving-state determination counter is incremented until it reaches a set value; the stationary-state determination counter is decremented and after it reaches '0', it is fixed at '0'.

During stationary-state period P2, the stationary-state determination counter is incremented until it reaches a set value; the moving-state determination counter is decremented and after it reaches '0', it is fixed at '0'.

Then, when a change from stationary-state period P2 to moving-state period P3 occurs again, the moving-state determination counter is incremented until it reaches a set value;

the stationary-state determination counter is decremented and after it reaches '0', it is fixed at '0'.

Returning to FIG. 1, the self-stationary determination circuit 106 determines whether or not the reception device 100 itself is stationary on the basis of a plurality of detection results from the stationary-state detection circuits 105. For example, the self-stationary determination circuit 106 determines whether the reception device 100 itself is stationary or not on the basis of the stationary-state determination signals output from the stationary-state detection circuits 105, and outputs a self-stationary determination signal to a downstream stage. In addition, the determination made by the self-stationary determination circuit 106 is the final determination as to whether the reception device 100 itself is stationary or not.

The self-stationary determination circuit 106 determines that the reception device 100 is stationary, for example, if at least a predetermined number of detection results among the plurality of detection results of the stationary-state detection performed by the stationary-state detection circuits 105 indicate that the reception device 100 is stationary. In this embodiment, the self-stationary determination circuit 106 determines that the reception device 100 itself is stationary, if at least one of the plurality of stationary-state determination signals is active (it is determined to be stationary).

In addition, the predetermined number may be a number other than '1'. For example, the self-stationary determination circuit 106 may devalue the reliability of a stationary-state determination signal output from the stationary-state detection circuit 105 in which the electric power information output from the AGC circuit 103 is determined to be smaller than the threshold value, and may determine, by a majority decision, that the reception device 100 itself is stationary. In this case, the predetermined number is a majority of the stationary-state determination signals that are the detection results from the stationary-state detection circuits 105.

Moreover, the self-stationary determination circuit 106 may determine that the reception device 100 itself is stationary, by also factoring in relations among reception locations.

As an example, FIGS. 5(A) to 5(E) are schematic diagrams illustrating temporal changes in the amounts of fluctuation in the electric power information in the stationary-state detection circuits 105A, 105B, 105C and 105D, in a case where a car 130 capable of receiving radio waves at four locations, i.e., front, back, left, and right locations, on its car body, is temporarily stopped on a road shoulder.

Figure 5:
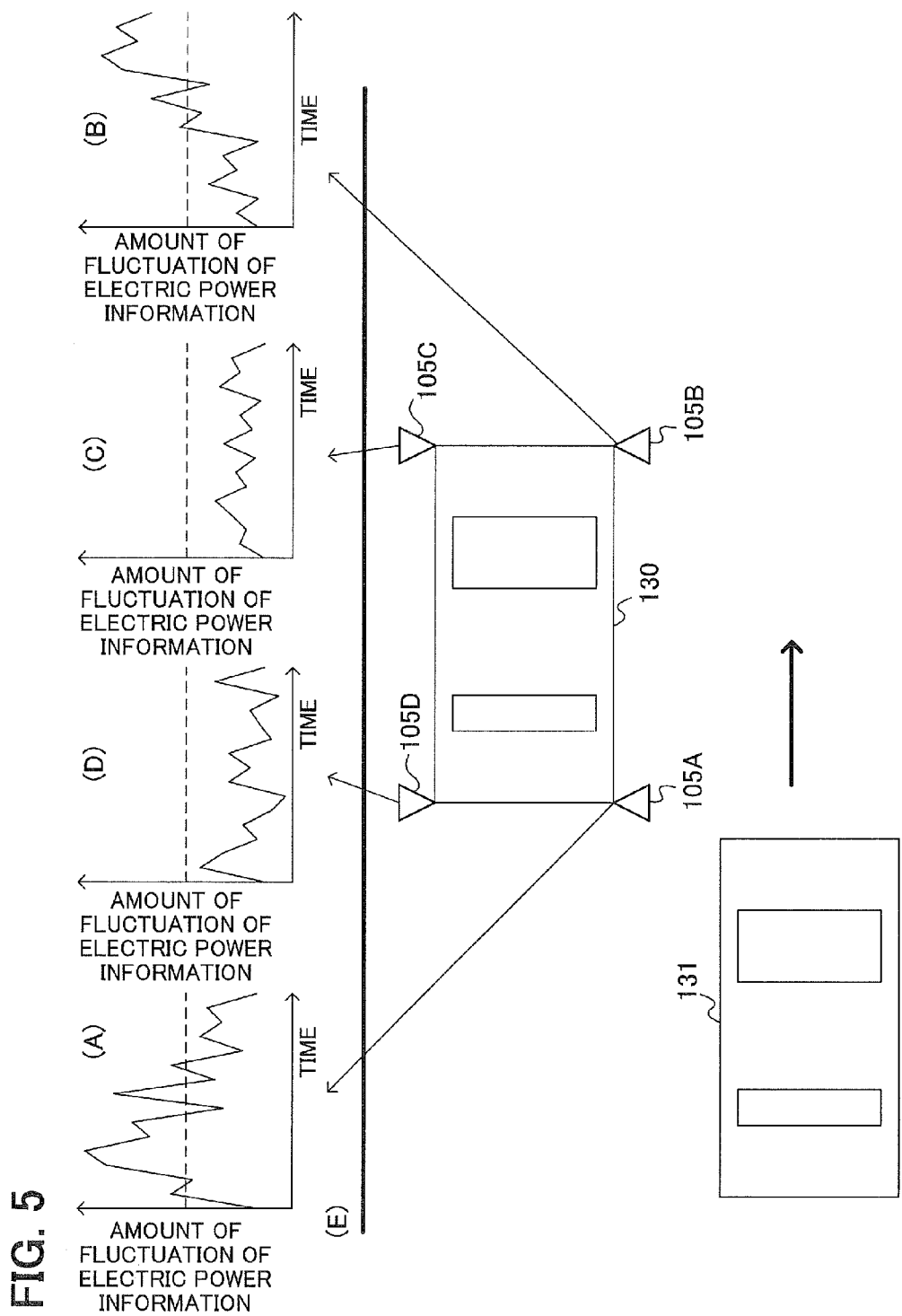
FIGS. 5(A) to 5(E) are schematic diagrams illustrating temporal changes in the amount of fluctuation in the electric power information in the stationary-state detection circuit in a case where a car capable of receiving radio waves at four locations, i.e., front, back, left, and right locations, on the car body, is temporarily stopped on a road shoulder.

As shown in FIG. 5(E), in the car 130, the antennas 101 are installed at the four locations, i.e., front, back, left, and right locations on the car body, and the stationary-state detection circuits 105 calculate the amounts of fluctuation in signal strengths of received signals obtained from radio waves received at the respective antennas 101.

As shown in FIG. 5(A), when a car 131 approaches from the rear, the stationary-state detection circuit 105A is immediately affected by waves reflected from the car 131 and the calculated amount of fluctuation increases. After the car 131 passes by, the amount of fluctuation decreases.

As shown in FIG. 5(B), when the car 131 approaches from the rear, the stationary-state detection circuit 105B is unaffected at first and the amount of fluctuation is small. As the car 131 passes by, the amount of fluctuation increases.

As shown in FIGS. 5(C) and 5(D), the stationary-state detection circuits 105C and 105D are hardly affected by the passage of the car 131 and the amounts of fluctuation are small, since the antennas 101 are installed on the side opposite the side where the car 131 passes by. Accordingly, the stationary-state determination signals which are output signals from the stationary-state detection circuits 105C and 105D become active. Thus, the self-stationary determination circuit 106 can identify, from the amounts of fluctuation in the electric power information, fluctuations that occur because of movement in the surrounding environment, and can therefore determine that the reception device 100 itself is stationary. In addition, when the reception device 100 itself moves, temporal fluctuations occur in all the stationary-state detection circuits 105A, 105B, 105C and 105D.

If the self-stationary determination signal output from the self-stationary determination circuit 106 is active (it is indicated that the reception device 100 itself is stationary), a processing circuit arranged at a downstream stage of the self-stationary determination circuit 106 carries out predetermined control in the stationary state. For example, the demodulation circuit 104 dynamically controls time domain filter coefficients used for estimation of transmission path characteristics to be used, in a completely stationary state and a low-speed moving state. More specifically, improvement can be expected in performance of the demodulation circuit 104, by making the passband of the filter in the completely stationary state narrower than the passband of the filter in the low-speed moving state.

Moreover, as another example, by performing stationary vehicle detection on the basis of the self-stationary determination signal from the self-stationary determination circuit 106, it is possible to allow a navigation screen operation when the vehicle is stopped, on the basis of a result of the detection. In this case, an example where stationary vehicle detection is performed depending on whether a parking brake is set or not is common, but an equivalent can be implemented by using this embodiment, and therefore a recognition wire from a parking brake can be eliminated and a cost reduction can be expected.

Thus the reception device 100 according to this embodiment detects that the reception device 100 is stationary on the basis of radio waves received at a plurality of places, and when the reception device 100 is stationary but there is movement in surrounding environment of the reception device 100, at least one amount of fluctuation is small, among a plurality of amounts of fluctuation in electric power information on the basis of the radio waves received at the plurality of places. Because the stationary state of the reception device 100 itself can thereby be detected, performance in the stationary state can be improved, and costs can be reduced because there is no need to obtain external information indicating the stationary state.

Second Embodiment

Figure 6:
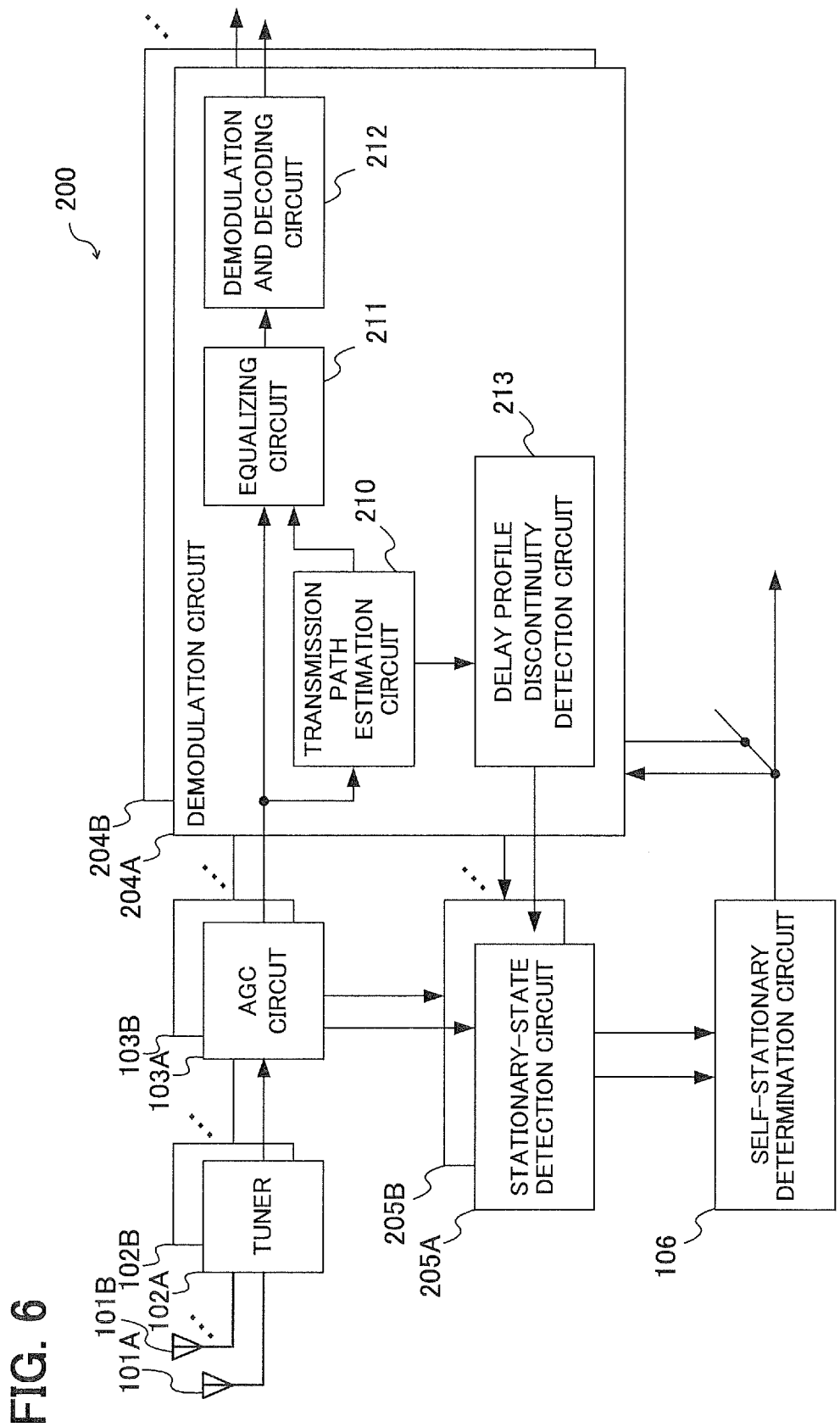
FIG. 6 is a block diagram schematically illustrating the configuration of a reception device according to a second embodiment.

FIG. 6 is a block diagram schematically illustrating the configuration of a reception device 200 according to a second embodiment.

The reception device 200 includes a plurality of antennas 101, a plurality of tuners 102, a plurality of AGC circuits 103, a plurality of demodulation circuits 204A, 204B, ... (referred to below as demodulation circuits 204 when there is no need to distinguish them from each other in particular), a plurality of stationary-state detection circuits 205A, 205B, ... (referred to below as stationary-state detection circuits 205 when there is no need to distinguish them from each other in particular), and a self-stationary determination circuit 106. In FIG. 6, the same reference numerals are given to component elements that are similar to the component elements of the reception device 100 according to the first embodiment shown in FIG. 1, and repeated descriptions will be omitted.

The demodulation circuits 204 constitute a demodulation unit for individually correcting distortion on a transmission path from respective adjusted received signals supplied from the AGC circuits 103, and performing demodulation and decoding on the corrected signals. The demodulation circuit 204 includes a transmission path estimation circuit 210, an equalizing circuit 211, a demodulation and decoding circuit 212, and a delay profile discontinuity detection circuit 213. In addition, the number of the demodulation circuits 204 is the same as the number of the AGC circuits 103, each of the demodulation circuits 204 is connected to each of the AGC circuits 103, and thus the demodulation circuits 204 can individually process the respective adjusted received signals supplied from the AGC circuits 103.

The transmission path estimation circuits 210 individually estimate delay profiles from the respective adjusted received signals supplied from the AGC circuits 103. Then, the transmission path estimation circuits 210 supply the estimated delay profiles to the equalizing circuits 211 and delay profile discontinuity detection circuits 213.

In terrestrial digital broadcasting in Japan, for example, pilot signals as known signals are inserted into received signals; therefor, by interpolating and extrapolating such pilot signals, the transmission path estimation circuit 210 can estimate a delay profile of a signal between known signals.

The equalizing circuits 211 individually correct distortion in the respective adjusted received signals supplied from the AGC circuits 103 on the basis of the delay profiles supplied from the transmission path estimation circuits 210. Then, the equalizing circuits 211 supply the corrected received signals to the demodulation and decoding circuits 212.

The demodulation and decoding circuits 212 individually demodulate and decode the respective corrected received signals supplied from the equalizing circuits 211. The demodulation and decoding circuits 212 supply the demodulated and decoded signals to a downstream stage.

The delay profile discontinuity detection circuits 213 individually monitor continuity of the respective delay profiles supplied from the transmission path estimation circuits 210, and individually detect whether each of the delay profiles is discontinuous or not. When detecting that the shape of the delay profile loses continuity, in other words, that it is discontinuous, the delay profile discontinuity detection circuit 213 makes a discontinuity determination signal active and supplies it to the corresponding stationary-state detection circuit 205.

For example, the delay profile discontinuity detection circuit 213 compares the position or size of a peak that exceeds a set fifth threshold value in a delay profile with that in its preceding delay profile, every time the delay profile is updated. If the amount of fluctuation in the position or size of the peak exceeds a set fluctuation value (sixth threshold value), the delay profile discontinuity detection circuit 213 detects that the delay profile is discontinuous. Here, the delay profile discontinuity detection circuit 213 may detect a peak in a main wave and monitor only the single main wave, or may detect a plurality of peaks. In addition, the set fifth threshold value and fluctuation value (sixth threshold value) mentioned above may be preset, or may be externally supplied.

The stationary-state detection circuits 205 calculate the amounts of time domain fluctuation from the electric power information supplied from the AGC circuits 103. In this case, if the discontinuity determination signal supplied from the corresponding delay profile discontinuity detection circuit 213 is active, the stationary-state detection circuit 205 processes so as not to make use of the calculated result.

More specifically, if the discontinuity determination signal is active, the stationary-state detection circuit 205 does not record, in a memory inside or outside its own circuitry, the input electric power information itself and the amount of fluctuation in the electric power information calculated in the amount-of-fluctuation-in-electric-power-information calculation step S11 in FIG. 3, but proceeds to the termination step S20. In other words, if the discontinuity determination signal is active, the stationary-state detection circuit 205 does not carry out the amount-of-fluctuation comparison step S12, the stationary state progress step S13, the stationary state determination step S14, the stationary state determination processing step S15, the moving state progress step S16, the moving state determination step S17, the moving state determination processing step S18, and the initialization step S19. The stationary-state detection circuit 205 may be configured to nor carry out the amount-of-fluctuation-in-electric-power-information calculation step S11 if the discontinuity determination signal is active.

On the other hand, if the discontinuity determination signal is inactive, the stationary-state detection circuit 205 carries out the processing flow shown in FIG. 3.

By carrying out the process described above, the stationary-state detection circuit 205 can eliminate singularities in the received signals and can improve reliability of the amount of fluctuation in the electric power information. Thus the reception device 200 can improve the accuracy of the stationary state detection. That is, at the self-stationary determination circuit 106, the accuracy of determination that the reception device 200 itself is stationary is improved.

Thus the reception device 200 according to the second embodiment can eliminate singularities in the received signals by detecting discontinuity of a delay profile, and therefore can detect with high accuracy that the reception device 200 itself is stationary.

Third Embodiment

FIG. 7 is a block diagram schematically illustrating the configuration of a reception device 300 according to a third embodiment.

The reception device 300 includes a plurality of antennas 101, a plurality of tuners 102, a plurality of AGC circuits 103, a plurality of demodulation circuits 304A, 304B, . . . (referred to below as demodulation circuits 304 when there is no need to distinguish them from each other in particular), a plurality of stationary-state detection circuits 205, and a self-stationary determination circuit 306. In FIG. 7, by giving the same reference numerals to component elements that are similar to the component elements of the reception device 100 according to the first embodiment shown in FIG. 1 or the component elements of the reception device 200 according to the second embodiment shown in FIG. 6, repetitious descriptions will be omitted.

The demodulation circuits 304 constitute a demodulation unit for individually correcting distortion on a transmission path from adjusted received signals supplied from the AGC circuits 103, and performing demodulation and decoding on the corrected signals. The demodulation circuit 304 includes a transmission path estimation circuit 210, an equalizing circuit 211, a demodulation and decoding circuit 212, a delay profile discontinuity detection circuit 213, and a delay profile shape monitoring circuit 314. The demodulation circuits 304 in the third embodiment differ from the demodulation circuits 204 in the second embodiment in that the demodulation circuits 304 further include the delay profile shape monitoring circuits 314. In addition, the transmission path estimation circuits 210 also supply estimated delay profiles to the delay profile shape monitoring circuits 314. In addition, the number of the demodulation circuits 304 is the same as the number of the AGC circuits 103, each of the demodulation circuit 304 is connected to each of the AGC circuit 103, and thus the demodulation circuits 304 can individually process the adjusted received signals supplied from the AGC circuits 103.

The delay profile shape monitoring circuits 314 individually detect reflected waves caused by a fixed object from the shapes of respective delay profiles supplied from the transmission path estimation circuits 210. Then, the delay profile shape monitoring circuits 314 individually monitor a fluctuation in the shape of the detected reflected wave, and individually detect whether the reception device 300 is stationary or not on the basis of the fluctuation. Moreover, if detecting that the reception device 300 is stationary, the delay profile shape monitoring circuits 314 make amount-of-fluctuation-exceeds-reference-value signals inactive, and supply the signals to the self-stationary determination circuit 306.

In a delay profile, the size of a peak in the reflected wave varies due to fading in the surrounding environment, but the position of the peak is the same, when the reception device 300 itself does not move. By using this property, the delay profile shape monitoring circuit 314 monitors the position of a peak that exceeds a set threshold value (seventh threshold value), every time the delay profile is updated. The set threshold value (seventh threshold value) mentioned above may be preset, or may be externally supplied.

More specifically, if a peak in the same position is detected a set number of times A (eighth threshold value), the delay profile shape monitoring circuit 314 estimates that the peak represents a reflected wave due to a fixed object, considers that the reception device 300 itself is stationary, and thus makes the amount-of-fluctuation reference-value excess signal inactive.

On the other hand, after the detection of the peak position, if peaks are detected a set number of times B (ninth threshold value) in positions different from the position where the peak is detected previously, the delay profile shape monitoring circuit 314 determines that the reception device 300 itself starts moving and thus makes the amount-of-fluctuation-exceeds-reference-value signal active. Moreover, after the detection of the peak position, if the number of times the amount of fluctuation in the peak size exceeds a set threshold value C (tenth threshold value) is equal to or greater than a set number of times D (eleventh threshold value), the delay profile shape monitoring circuit 314 determines that the reception device 300 itself starts moving and thus makes the amount-of-fluctuation-exceeds-reference-value signal active. When the reception device 300 starts moving, the peak position of the reflected wave caused by the fixed object shifts to another position, but a noise component or the like sometimes appears in the peak position before the shift, for example. It is preferable to compare the amount of fluctuation in the peak size with the set threshold value C so that it is possible even in such a case to detect that the reception device 300 is moving. It is preferable to set the threshold value C here to a value greater than the amount of fluctuation due to fading. In addition, the set number of times A, set threshold value B, set number of times C, and set number of times D mentioned above may be preset, or may be externally supplied.

The self-stationary determination circuit 306 determines whether the reception device 300 itself is stationary or not, by using the amount-of-fluctuation-exceeds-reference-value signals supplied from the delay profile shape monitoring circuits 314 and the stationary-state determination signals output from the stationary-state detection circuits 205.

For example, the self-stationary determination circuit 306 can determine that the reception device 300 itself is stationary, on the basis of the stationary-state determination signals as in the first embodiment, and can also determine that the reception device 300 itself is stationary, if any of the amount-of-fluctuation-exceeds-reference-value signals is inactive. In addition, the self-stationary determination circuit 306 can also determine that the reception device 300 is moving, if all the amount-of-fluctuation-exceeds-reference-value signals are active.

For example, the self-stationary determination circuit 306 can determine that the reception device 300 itself is stationary, on the basis of the stationary-state determination signals as in the first embodiment, and can also determine that the reception device 300 itself is stationary, if any of the amount-of-fluctuation-exceeds-reference-value signals is inactive. In addition, the self-stationary determination circuit 306 can also determine that the reception device 300 is moving, if all the amount-of-fluctuation-exceeds-reference-value signals are active.

Thus by monitoring peak fluctuations in reflected waves due to fixed objects from the delay profiles, the reception device 300 according to the third embodiment can incorporate indicators of whether the reception device 300 is stationary into the determination of whether the reception device 300 itself is stationary, so the stationary state of the reception device 300 itself can be detected accurately.

Although the first to third embodiments described above include pluralities of tuners 102, AGC circuits 103, stationary-state detection circuits 105, 205, and demodulation circuits 104, 204, 304 corresponding to the plurality of antennas 101, each of these circuits may be constituted by a single circuit, or the number of these circuits need not be the same as the number of the antennas 101, provided the circuits can individually process on the basis of each of the plurality of radio waves received by the plurality of antennas 101. For example, these circuits may be replaced by single circuits, or a number of circuits differing from the number of antennas 101, that are configured to carry out processing on the basis of the plurality of radio waves received by the plurality of the antennas 101 by time division.

The embodiments disclosed above should be considered exemplary and non-limiting in all respects. The scope of the invention is indicated by the appended claims rather than by the foregoing description, and is intended to include all modifications that are within the meaning and scope of the claims and their equivalents.

Description Of Reference Characters 100, 200, 300 reception device, 101 antenna, 102 tuner, 103 AGC circuit, 104, 204, 304 demodulation circuit, 105, 205 stationary-state detection circuit, 106, 206, 306 self-stationary determination circuit, 210 transmission path estimation circuit, 211 equalizing circuit, 212 demodulation and decoding circuit, 213, delay profile discontinuity detection circuit, 314 delay profile shape monitoring circuit.

What is claimed is:
1. A reception device for receiving radio waves, comprising:
an automatic gain control unit to generate electric power information individually indicating signal strengths of respective received signals generated from each of radio waves received at a plurality of antennas installed at a plurality of different places on a vehicle;

a stationary-state detection unit to calculate individually amounts of time domain fluctuation in the respective signal strengths indicated by the electric power information generated by the automatic gain control unit, and to detect individually, on the basis of the calculated amounts of fluctuation, whether the reception device is stationary or not; and a self-stationary determination unit to determine, on the basis of a plurality of detection results from the stationary-state detection unit, whether the reception device is stationary or not.

2. The reception device of claim 1, wherein the self-stationary determination unit determines that the reception device is stationary if at least a predetermined number of detection results, among the plurality of detection results from the stationary-state detection unit, indicate that the reception device is stationary.

3. The reception device of claim 2, wherein the predetermined number is '1'.

4. The reception device of claim 2, wherein the predetermined number is a majority of the plurality of detection results of stationary-state detection performed by the stationary-state detection unit.

5. The reception device of claim 1, wherein the automatic gain control unit also individually adjusts electric power of the respective received signals generated from each of the radio waves received at the plurality of antennas, the reception device further comprising:
a transmission path estimation unit to estimate individually delay profiles from the respective received signals adjusted by the automatic gain control unit; and
a delay profile discontinuity detection unit to detect individually whether each of the delay profiles estimated by the transmission path estimation unit is discontinuous or not;
wherein if the delay profile discontinuity detection unit detects that at least one of the delay profiles estimated by the transmission path estimation unit is discontinuous, the stationary-state detection unit does not detect whether the reception device is stationary or not, on the basis of electric power information corresponding to a radio wave received at a place where the delay profile is detected to be discontinuous, among the plurality of places.

6. The reception device of claim 1, wherein the automatic gain control unit also individually adjusts electric power of the respective received signals generated from each of the radio waves received at the plurality of antennas, the reception device further comprising:
a transmission path estimation unit to estimate individually delay profiles from the respective received signals adjusted by the automatic gain control unit;
a delay profile discontinuity detection unit to detect individually whether each of the delay profiles estimated by the transmission path estimation unit is discontinuous or not; and
a delay profile shape monitoring unit to detect individually reflected waves caused by a fixed object, from a shape of each of the delay profiles estimated by the transmission path estimation unit, and to detect individually whether the reception device is stationary or not, on the basis of fluctuations in the respective detected reflected waves;
wherein the self-stationary determination unit determines whether the reception device is stationary or not, on the basis of the plurality of detection results from the stationary-state detection unit and detection results from the delay profile shape monitoring unit.

7. The reception device of claim 1, further comprising:
the plurality of antennas; and
a reception unit to generate individually received signals from each of the radio waves received at the plurality of antennas;
wherein at least any one of the automatic gain control unit, the stationary-state detection unit, and the reception unit is constituted by multiple units.

8. A reception method comprising:
a signal strength detection step to generate electric power information individually indicating signal strengths of respective received signals generated from each of radio waves received at a plurality of antennas installed at a plurality of different places on a vehicle;
a stationary-state detection step to calculate individually amounts of time domain fluctuation in the respective signal strengths indicated by the electric power information generated in the signal strength detection step, and to detect individually, on the basis of each of the calculated amounts of fluctuation, whether a stationary-state is detected or not; and
a self-stationary determination step to determine, on the basis of a plurality of detection results from the stationary-state detection step, whether the stationary-state is detected or not.

9. The reception method of claim 8, wherein the self-stationary determination step determines that the stationary-state is detected, if at least a predetermined number of detection results, among a plurality of detection results of stationary-state detection performed in the stationary-state detection step, indicate that the stationary-state is detected.

10. The reception method of claim 9, wherein the predetermined number is '1'.

11. The reception method of claim 9, wherein the predetermined number is a majority of the plurality of detection results of the stationary-state detection performed in the stationary-state detection step.

12. The reception method of claim 8, further comprising:
an automatic gain control step to adjust individually electric power of the respective received signals generated from each of the radio waves received at the plurality of antennas;
a transmission path estimation step to estimate individually delay profiles from the respective received signals adjusted in the automatic gain control step; and
a delay profile discontinuity detection step to detect individually whether each of the delay profiles estimated in the transmission path estimation step is discontinuous or not;
wherein if the delay profile discontinuity detection step detects that at least one of the delay profiles estimated in the transmission path estimation step is discontinuous, the stationary-state detection step does not detect whether the stationary-state is detected or not, on the basis of electric power information corresponding to a radio wave received at a place where the delay profile is detected to be discontinuous, among the plurality of places.

13. The reception method of claim 8, further comprising:
an automatic gain control step to adjust individually electric power of the respective received signals generated from each of the radio waves received at the plurality of antennas;
a transmission path estimation step to estimate individually delay profiles from the respective received signals adjusted in the automatic gain control step;

a delay profile discontinuity detection step to detect individually whether each of the delay profiles estimated in the transmission path estimation step is discontinuous or not; and a delay profile shape monitoring step to detect individually reflected waves caused by a fixed object from a shape of each of the delay profiles estimated in the transmission path estimation step, and to detect individually whether the stationary-state is detected or not, on the basis of fluctuations in the respective detected reflected waves;

wherein the self-stationary determination step performs determination of whether the stationary-state is detected or not, on the basis of the plurality of detection results from the stationary-state detection step and detection results from the delay profile shape monitoring step.

14. The reception method of claim 8, further comprising a reception step to receive each radio waves at the respective plurality of antennas, and to generate individually received signals from each of the radio waves.

\* \* \* \* \*